US012261588B2

(12) United States Patent
Tsukamoto

(10) Patent No.: US 12,261,588 B2
(45) Date of Patent: Mar. 25, 2025

(54) ELECTRONIC COMPONENT

(71) Applicant: TDK CORPORATION, Tokyo (JP)

(72) Inventor: Kazuhiro Tsukamoto, Tokyo (JP)

(73) Assignee: TDK CORPORATION, Tokyo (JP)

( * ) Notice: Subject to any disclaimer, the term of this patent is extended or adjusted under 35 U.S.C. 154(b) by 250 days.

(21) Appl. No.: 17/961,639

(22) Filed: Oct. 7, 2022

(65) Prior Publication Data

US 2023/0115011 A1 Apr. 13, 2023

(30) Foreign Application Priority Data

Oct. 12, 2021 (JP) .................................. 2021-167547

(51) Int. Cl.
*H03H 9/64* (2006.01)
*H03H 7/01* (2006.01)
*H03H 9/05* (2006.01)
*H03H 9/54* (2006.01)
*H03H 9/70* (2006.01)

(52) U.S. Cl.
CPC .......... *H03H 9/542* (2013.01); *H03H 7/0115* (2013.01); *H03H 9/0538* (2013.01); *H03H 9/70* (2013.01)

(58) Field of Classification Search
CPC .. H03H 9/6463; H03H 9/6466; H03H 9/6433; H03H 9/6453; H03H 9/542; H03H 9/0538; H03H 9/70

USPC ................................. 333/185–186, 190–193
See application file for complete search history.

(56) References Cited

U.S. PATENT DOCUMENTS

| 2005/0264375 | A1 | 12/2005 | Ikuta et al. | |
| 2005/0285700 | A1 | 12/2005 | Koga et al. | |
| 2006/0192632 | A1* | 8/2006 | Nakai | H03H 7/463 333/133 |
| 2010/0271154 | A1* | 10/2010 | Tsutsumi | H03H 9/1071 333/204 |
| 2017/0179930 | A1 | 6/2017 | Tsukamoto et al. | |
| 2017/0214390 | A1 | 7/2017 | Tsukamoto et al. | |

FOREIGN PATENT DOCUMENTS

| JP | 2006-014096 A | 1/2006 |
| JP | 2006-186907 A | 7/2006 |
| JP | 2010-068079 A | 3/2010 |

* cited by examiner

*Primary Examiner* — Rakesh B Patel
(74) *Attorney, Agent, or Firm* — Oliff PLC

(57) ABSTRACT

An electronic component includes a first main body including a plurality of dielectric layers stacked together, and a second main body mounted to the first main body. The second main body includes a first circuit section and a second circuit section that are each constituted by using at least one acoustic wave element and are electrically separated from each other. The first main body includes first to third ground conductor layers located between the first and second circuit sections when seen in a Z direction.

12 Claims, 9 Drawing Sheets

ELECTRONIC COMPONENT

BACKGROUND OF THE INVENTION

1. Field of the Invention

The present invention relates to an electronic component where a main body including an acoustic wave element is mounted to another main body.

2. Description of the Related Art

Compact mobile communication apparatuses are generally configured to use a single common antenna for a plurality of applications that use different systems and have different service frequency bands, and to use a branching filter to separate from each other a plurality of signals received and transmitted by the antenna.

A branching filter for separating from each other a first signal of a frequency within a first frequency band and a second signal of a frequency within a second frequency band higher than the first frequency band typically includes a common port, a first signal port, a second signal port, a first filter provided in a first signal path leading from the common port to the first signal port, and a second filter provided in a second signal path leading from the common port to the second signal port.

US 2017/0179930 A1 and US 2017/0214390 A1 disclose a branching filter that includes two filters each including an LC resonator and an acoustic wave resonator as first and second filters. An acoustic wave resonator refers to a resonator constituted by using an acoustic wave element. An acoustic wave element refers to an element using acoustic waves. Examples of the acoustic wave elements include a surface acoustic wave element using surface acoustic waves and a bulk acoustic wave element using bulk acoustic waves. The branching filters disclosed in US 2017/0179930 A1 and US 2017/0214390 A1 include two physically separated acoustic wave resonators mounted on a stack including LC resonators.

There has been a demand for miniaturization of a branching filter used in a compact communication apparatus in particular. However, if two physically separated acoustic wave resonators are used, the two acoustic wave resonators need to be disposed at some distance from each other to reduce electromagnetic coupling between the two acoustic wave resonators. There has thus been a problem that the entire branching filter is difficult to miniaturize. Such a branching filter has also had a problem of increased cost as compared to the case of using a single acoustic wave resonator.

The abovementioned problems are not limited to branching filters, and apply to electronic components in general that include two circuit sections each constituted by using an acoustic wave element.

SUMMARY OF THE INVENTION

An object of the present invention is to provide an electronic component that includes two circuit sections each constituted by using an acoustic wave element and is capable of miniaturization and cost reduction.

An electronic component according to the present invention includes a first main body including a plurality of dielectric layers stacked together, and a second main body mounted to the first main body. The second main body includes a first circuit section and a second circuit section that are each constituted by using at least one acoustic wave element and are electrically separated from each other. The first main body includes at least one ground conductor layer located between the first and second circuit sections when seen in a first direction parallel to a direction in which the first and second main bodies are arranged.

In the electronic component according to the present invention, the first direction may be a direction parallel to a stacking direction of the plurality of dielectric layers.

In the electronic component according to the present invention, the second main body may include a first terminal, a second terminal, a third terminal, and a fourth terminal that are disposed on an outer surface of the second main body. The first circuit section may be provided between the first and second terminals in a circuit configuration. The second circuit section may be provided between the third and fourth terminals in the circuit configuration. The first and third terminals may be disposed to sandwich the at least one ground conductor layer therebetween when seen in the first direction. The second and fourth terminals may be disposed to sandwich the at least one ground conductor layer therebetween when seen in the first direction.

In the electronic component according to the present invention, the at least one ground conductor layer may protrude from the second main body when seen in the first direction.

In the electronic component according to the present invention, the at least one ground conductor layer may be provided inside the first main body.

In the electronic component according to the present invention, the first main body may have a first surface where the second main body is mounted, and a second surface opposite thereto. In such a case, the at least one ground conductor layer may be disposed at a position closer to the first surface than to the second surface.

In the electronic component according to the present invention, the at least one ground conductor layer may include a plurality of ground conductor layers. In such a case, the first main body may further include a plurality of through holes that connect the plurality of ground conductor layers to each other. The plurality of ground conductor layers may include a first ground conductor layer, a second ground conductor layer, and a third ground conductor layer that are disposed at respective different positions in the first direction. The plurality of through holes may include a plurality of first through holes that electrically connect the first and second ground conductor layers, and a plurality of second through holes that electrically connect the second and third ground conductor layers. The plurality of first through holes and the plurality of second through holes may be disposed so as not to overlap when seen in the first direction.

In the electronic component according to the present invention, the first main body may include a third circuit section and a fourth circuit section that are disposed to sandwich the at least one ground conductor layer therebetween when seen in the first direction. In such a case, the first circuit section may be electrically connected to the third circuit section. The second circuit section may be electrically connected to the fourth circuit section. The first and third circuit sections may constitute a first filter that selectively passes a signal of a frequency within a first passband. The second and fourth circuit sections may constitute a second filter that selectively passes a signal of a frequency within a second passband higher than the first passband.

In the electronic component according to the present invention, the second main body includes the first and second circuit sections. The first main body includes the at least one ground conductor layer located between the first and second circuit sections when seen in the first direction. According to the present invention, the electronic component can thereby be miniaturized in size and reduced in cost.

Other and further objects, features, and advantages of the technology will appear more fully from the following description.

DETAILED DESCRIPTION OF THE PREFERRED EMBODIMENTS

Figure 1:
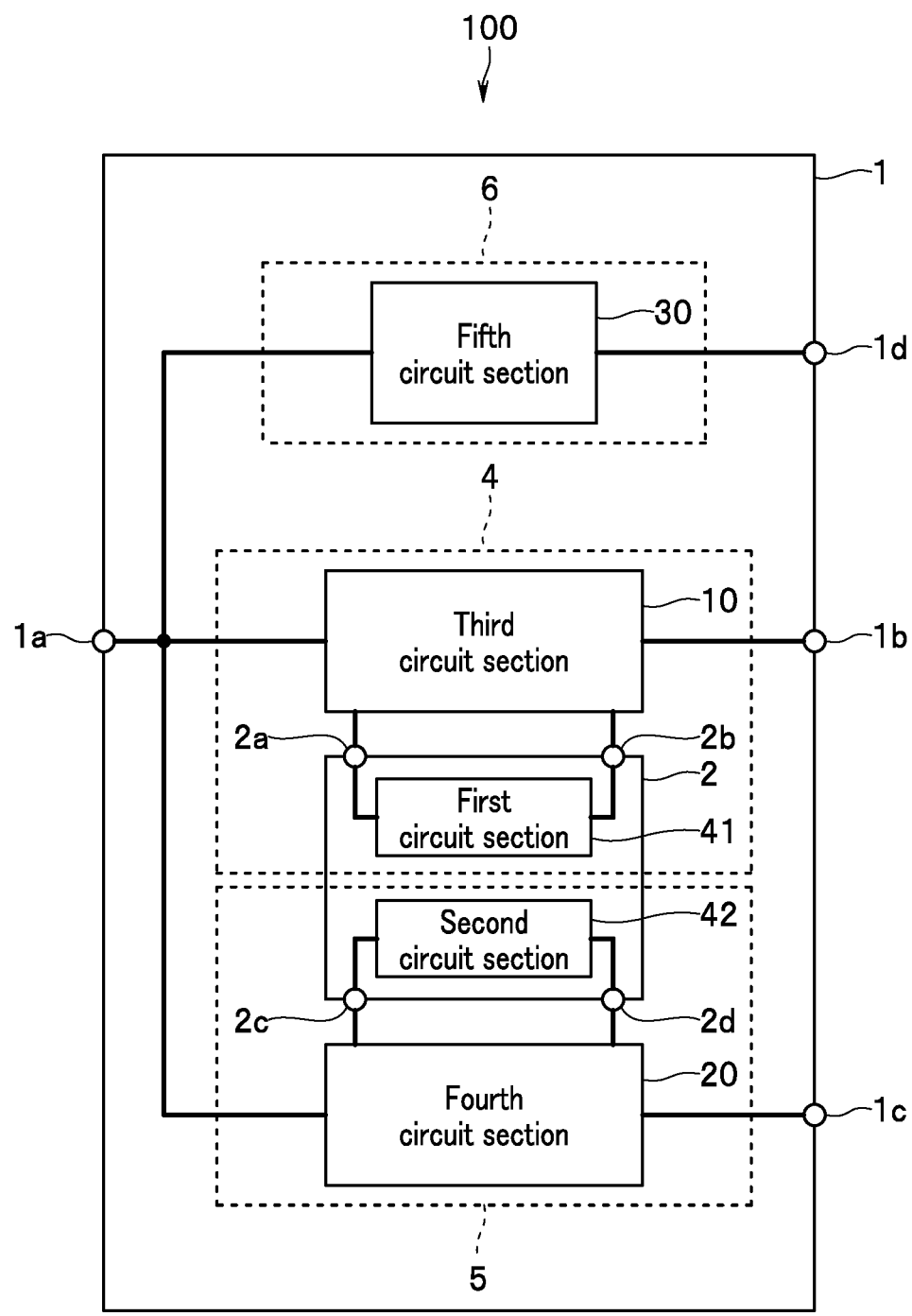
FIG. 1 is a block diagram showing a configuration of an electronic component according to an embodiment of the present invention.

An embodiment of the present invention will be described in detail below with reference to the drawings. First, a schematic configuration of an electronic component 100 according to the embodiment of the present invention will be described with reference to FIG. 1. FIG. 1 is a block diagram showing the configuration of the electronic component 100.

The electronic component 100 according to the present embodiment is a branching filter (triplexer) including a first filter 4, a second filter 5, and a third filter 6. The first filter 4 is configured to selectively pass a first signal of a frequency within a first passband. The second filter 5 is configured to selectively pass a second signal of a frequency within a second passband higher than the first passband. The third filter 6 is configured to selectively pass a third signal of a frequency within a third passband lower than the first passband.

The first filter 4 includes a third circuit section 10. The second filter 5 includes a fourth circuit section 20. The third filter 6 includes a fifth circuit section 30. Each of the third to fifth circuit sections 10, 20, and 30 is an LC circuit including at least one inductor and at least one capacitor.

The first filter 4 further includes a first circuit section 41 electrically connected to the third circuit section 10. The second filter 5 further includes a second circuit section 42 electrically connected to the fourth circuit section 20. The first and second circuit sections 41 and 42 are electrically separated from each other. The first and second circuit sections 41 and 42 each include at least one acoustic wave element. Examples of the acoustic wave element may include a bulk acoustic wave element and a surface acoustic wave element. Each of the first and second circuit sections 41 and 42 may be an acoustic wave resonator.

The first circuit section 41 and the third circuit section 10 constitute a filter circuit (first filter 4). The second circuit section 42 and the fourth circuit section 20 constitute another filter circuit (second filter 5).

A first main body 1 further includes a common port 1a, a first signal port 1b, a second signal port 1c, and a third signal port 1d. The first filter 4 is provided between the common port 1a and the first signal port 1b in a circuit configuration. The second filter 5 is provided between the common port 1a and the second signal port 1c in the circuit configuration. The third filter 6 is provided between the common port 1a and the third signal port 1d in the circuit configuration. In the present application, the expression "in the (a) circuit configuration" is used to indicate not layout in physical configuration but layout in the circuit diagram.

Figure 2:
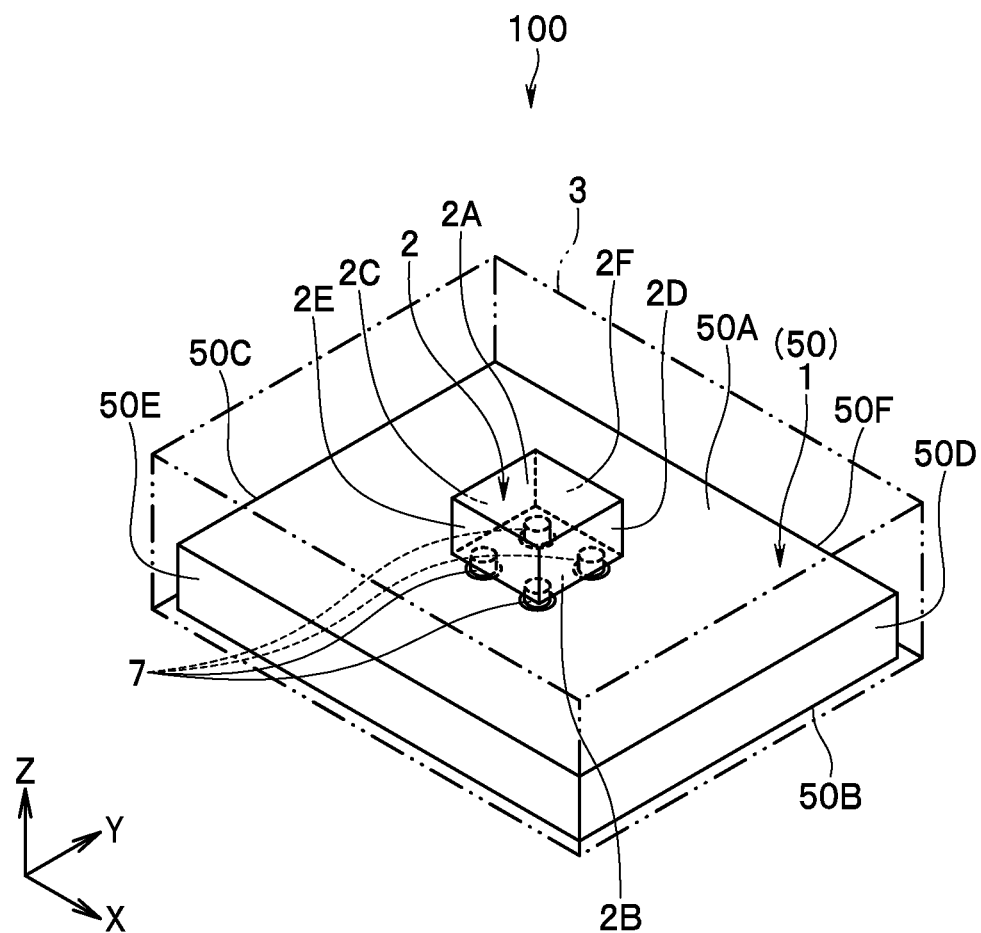
FIG. 2 is a perspective view of the electronic component according to the embodiment of the present invention.
Figure 3:
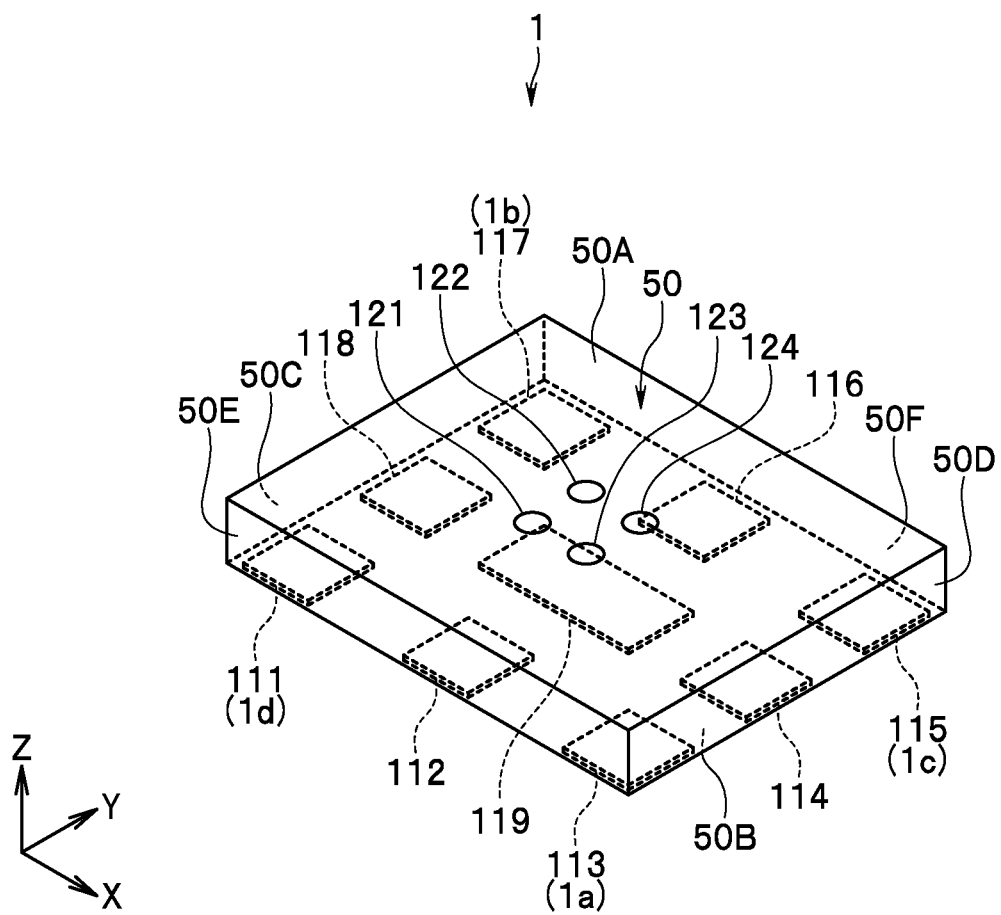
FIG. 3 is a perspective view of a first main body of the embodiment of the present invention.
Figure 4:
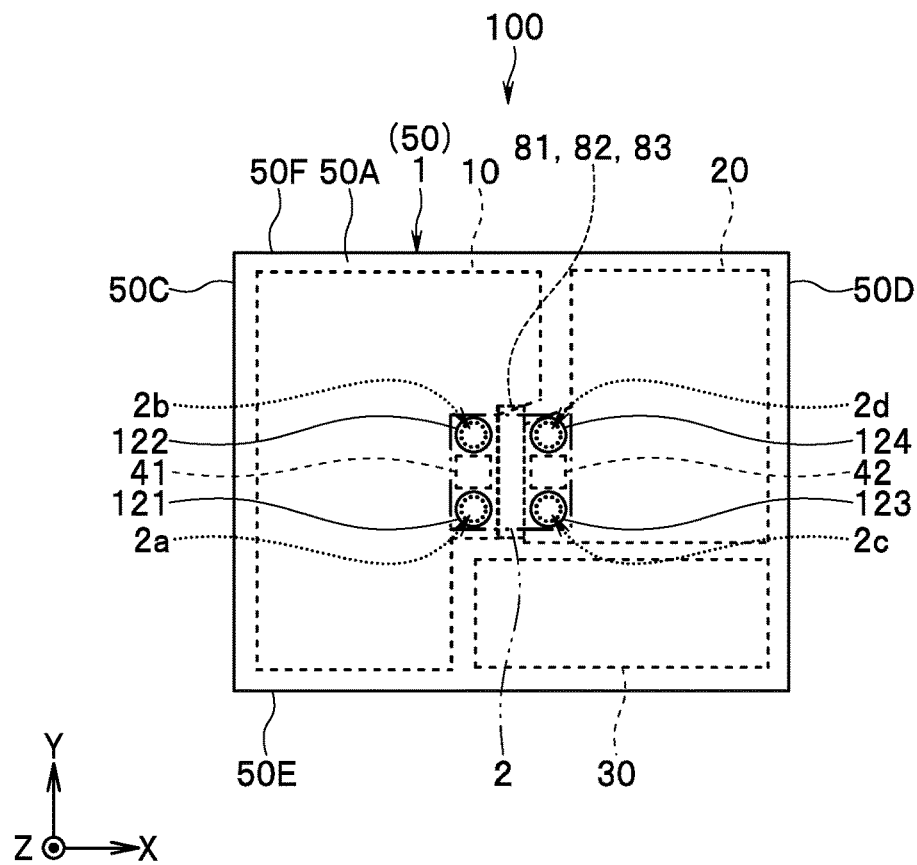
FIG. 4 is a plan view of the electronic component according to the embodiment of the present invention.
Figure 5:
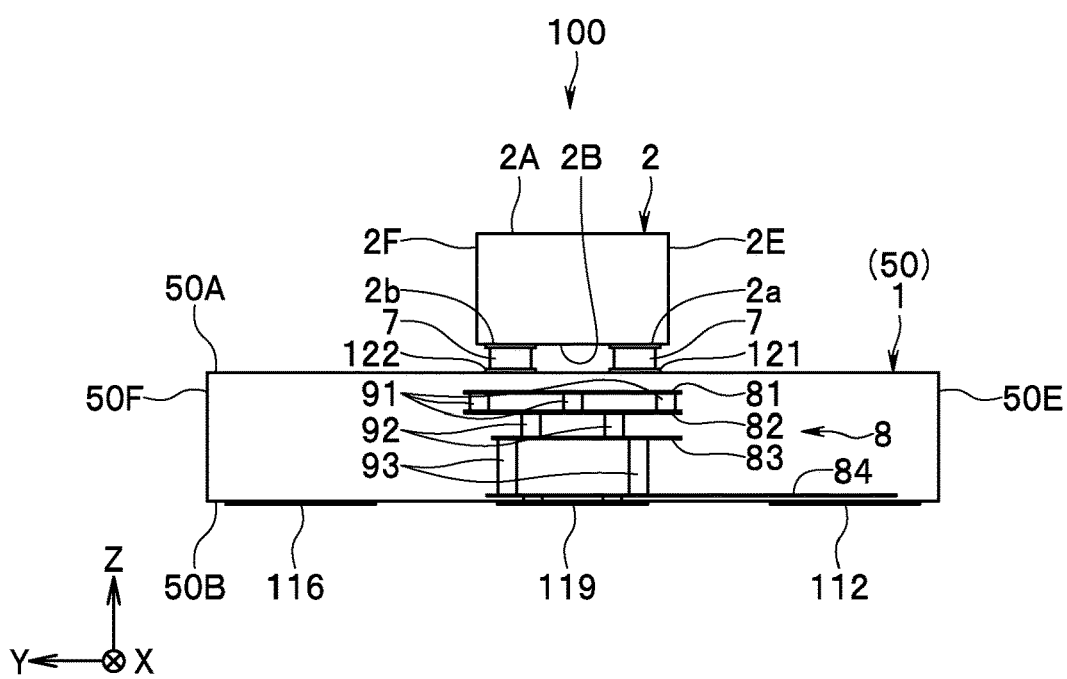
FIG. 5 is an explanatory diagram showing a plurality of ground conductor layers and a plurality of through holes of the embodiment of the present invention.

Next, the configuration of the electronic component 100 will be specifically described with reference to FIG. 1 to FIG. 5. FIG. 2 is a perspective view showing the electronic component 100. FIG. 3 is a perspective view showing the first main body of the present embodiment. FIG. 4 is a plan view showing the electronic component 100. FIG. 5 is an explanatory diagram showing a plurality of ground conductor layers and a plurality of through holes of the present embodiment.

As shown in FIG. 2, the electronic component 100 includes the first main body 1, a second main body 2 mounted to the first main body 1, and a sealing portion 3 that seals the first and second main bodies 1 and 2. The sealing portion 3 is constituted of a resin, for example.

A configuration of the first main body 1 will initially be described. The first main body 1 includes the third to fifth circuit sections 10, 20, and 30 shown in FIG. 1. The first main body 1 also includes a stack 50. The stack 50 includes a plurality of dielectric layers stacked together, and a plurality of conductor layers and a plurality of through holes formed on/in the dielectric layers. The LC circuits that are the respective third to fifth circuit sections 10, 20, and 30 are constituted using the plurality of dielectric layers, the plurality of conductor layers, and the plurality of through holes.

The plurality of through holes are formed by filling holes for forming respective through holes with a conductive paste. Each of the through holes is connected to a conductor layer or another through hole. In the following description, for the sake of convenience, a structure made of two or more through holes connected in series will also be referred to as a "through hole".

The stack 50 has a first surface 50A and a second surface 50B located at opposite ends in the stacking direction of the plurality of dielectric layers, and four side surfaces 50C to 50F connecting the first and second surfaces 50A and 50B. The side surfaces 50C and 50D are directed opposite to each other. The side surfaces 50E and 50F are also directed opposite to each other. The side surfaces 50C to 50F are perpendicular to the first and second surfaces 50A and 50B.

An X direction, a Y direction, and a Z direction will be defined as shown in FIG. 2 to FIG. 5. The X, Y and Z directions are orthogonal to each other. In the present embodiment, a direction parallel to the stacking direction will be referred to as the Z direction. The Z direction is also a direction parallel to that in which the first and second main bodies 1 and 2 are arranged. A direction opposite to the X direction will be referred to as a direction, a direction opposite to the Y direction as a direction, and a direction opposite to the Z direction as a direction.

As shown in FIG. 3, the first surface 50A is located at the end of the stack 50 in the Z direction. The first surface 50A is also a part of an outer surface of the first main body 1 where the second main body 2 is mounted, and is a top surface of the stack SO. The second surface 50B is located at the end of the stack 50 in the −Z direction. The second surface 50B is a surface opposite to the first surface 50A, and is also a bottom surface of the stack 50. The side surface 50C is located at the end of the stack 50 in the −X direction. The side surface 50D is located at the end of the stack 50 in the X direction. The side surface 50E is located at the end of the stack 50 in the −Y direction. The side surface 50F is located at the end of the stack 50 in the Y direction.

FIG. 4 shows the rough positions of the respective third to fifth circuit sections 10, 20, and 30 in the stack 50. The third circuit section 10 is disposed at a position closer to the side surface 50C than to the side surface 50D. The fourth and fifth circuit sections 20 and 30 are disposed between the third circuit section 10 and the side surface 50D. The fourth circuit section 20 is disposed at a position closer to the side surface 50F than to the side surface 50E. The fifth circuit section 30 is disposed at a position closer to the side surface 50E than to the side surface 50F.

As shown in FIG. 3, the first main body 1 further includes a plurality of terminals 111, 112, 113, 114, 115, 116, 117, 118, and 119 provided on the second surface 50B of the stack 50. The terminal 111 is disposed near the corner at the intersection of the second surface 50B, the side surface 50C, and the side surface 50E. The terminal 113 is disposed near the corner at the intersection of the second surface 50B, the side surface 50D, and the side surface 50E. The terminal 115 is disposed near the corner at the intersection of the second surface 50B, the side surface 50D, and the side surface 50F. The terminal 117 is disposed near the corner at the intersection of the second surface 50B, the side surface 50C, and the side surface 50F.

The terminal 112 is disposed between the terminals 111 and 113. The terminal 114 is disposed between the terminals 113 and 115. The terminal 116 is disposed between the terminals 115 and 117. The terminal 118 is disposed between the terminals 111 and 117. The terminal 119 is disposed at the center of the second surface 50B.

The terminal 111 corresponds to the third signal port 1d. The terminal 113 corresponds to the common port 1a. The terminal 115 corresponds to the second signal port 1c. The terminal 117 corresponds to the first signal port 1b. The common port 1a and the first to third signal ports 1b to 1d are thus provided on the second surface 50B of the stack 50. Each of the terminals 112, 114, 116, 118, and 119 is grounded.

The first main body 1 further includes a plurality of terminals 121, 122, 123, and 124 provided on the first surface 50A of the stack 50. The terminals 121 to 124 are disposed near the center of gravity of the first surface 50A. The terminals 121 and 122 are arranged in this order in the Y direction at positions on the −X direction side of the center of gravity of the first surface 50A. The terminals 123 and 124 are arranged in this order in the Y direction at positions on the X direction side of the center of gravity of the first surface 50A.

The first main body 1 further includes at least one ground conductor layer. In the present embodiment, the first main body 1 may include a plurality of ground conductor layers as the at least one ground conductor layer.

As shown in FIG. 5, in the present embodiment in particular, the first main body 1 includes, as the at least one ground conductor layer, a first ground conductor layer 81, a second ground conductor layer 82, and a third conductor layer 83 that are disposed at respective different positions in the Z direction. The first to third ground conductor layers 81, 82, and 83 are provided inside the first main body 1, i.e., inside the stack 50. The first to third ground conductor layers 81, 82, and 83 are arranged in the −Z direction in this order from the first surface 50A side.

At least one of the first to third ground conductor layers 81 to 83 is disposed at a position closer to the first surface 50A than to the second surface 50B. In particular, in the present embodiment, all the first to third ground conductor layers 81 to 83 are disposed at a position closer to the first surface 50A than to the second surface 50B.

The first to third ground conductor layers 81 to 83 each extend in a direction parallel to the Y direction, between the third and fourth circuit sections 10 and 20. The first to third ground conductor layers 81 to 83 may have the same or substantially the same shapes or respective different shapes. The third and fourth circuit sections 10 and 20 are disposed to sandwich the first to third ground conductor layers 81 to 83 therebetween.

The plurality of through holes in the first main body 1 includes a plurality of first through holes 91 electrically connecting the first and second ground conductor layers 81 and 82, and a plurality of second through holes 92 electrically connecting the second and third ground conductor layers 82 and 83. In particular, in the present embodiment, each of the first through holes 91 is in contact with both the first and second ground conductor layers 81 and 82. Each of the second through holes 92 is in contact with both the second and third ground conductor layers 82 and 83. The plurality of first through holes 91 and the plurality of second through holes 92 are disposed so as not to overlap when seen in the Z direction.

The first main body 1 further includes a ground conductor layer 84 disposed near the second surface 50B inside the stack 50. The ground conductor layer 84 is electrically connected to at least one of the grounded terminals 112, 114, 116, 118, and 119. The ground conductor layer 84 may have the same shape as that of one of the first to third ground conductor layers 81 to 83, or a shape different from that of any of the first to third ground conductor layers 81 to 83.

The plurality of through holes in the first main body 1 further include a plurality of through holes 93 electrically connecting the third ground conductor layer 83 and the ground conductor layer 84. In particular, in the present embodiment, each of the through holes 93 is in contact with both the third ground conductor layer 83 and the ground conductor layer 84. The plurality of second through holes 92 and the plurality of through holes 93 are disposed so as not to overlap when seen in the Z direction. The plurality of through holes 93 may be disposed so as not to overlap with the plurality of first through holes 91 when seen in the Z direction.

The third ground conductor layer 83 is electrically connected to at least one of the grounded terminals 112, 114, 116, 118, and 119 via the ground conductor layer 84 and the plurality of through holes 93. The second ground conductor layer 82 is electrically connected to the third ground conductor layer 83 via the plurality of second through holes 92. The first ground conductor layer 81 is electrically connected to the second ground conductor layer 82 via the plurality of first through holes 91. All the first to third ground conductor layers 81 to 83 are thus grounded.

The ground conductor layers 81 to 83 and the through holes 91 to 93 constitute a partition 8 that separates a part of the third circuit section 10 from a part of the fourth circuit section 20. The first main body 1 may further include a not-shown first partition that separates another part of the third circuit section 10 from another part of the fourth circuit section 20, and a not-shown second partition that separates yet another part of the third circuit section 10 from at least a part of the fifth circuit section 30. The first and second partitions may be directly or indirectly connected to the partition 8.

Next, a configuration of the second main body 2 will be described. The second main body 2 includes the first and second circuit sections 41 and 42 shown in FIG. 1. Moreover, the second main body 2 has a third surface 2A and a fourth surface 2B located at opposite ends in the direction parallel to a Z direction, and four side surfaces 2C to 2F connecting the third and fourth surfaces 2A and 2B. The side surfaces 2C and 2D are directed opposite to each other. The side surfaces 2E and 2F are also directed opposite to each other. The side surfaces 2C to 2F are perpendicular to the third and fourth surfaces 2A and 2B.

As shown in FIG. 2, the third surface 2A is located at the end of the second main body 2 in the Z direction. The third surface 2A is also a top surface of the second main body 2. The fourth surface 2B is located at the end of the second main body 2 in the −Z direction. The fourth surface 2B is a surface opposed to the first main body 1, and also a bottom surface of the second main body 2. The side surface 2C is located at the end of the second main body 2 in the −X direction. The side surface 2D is located at the end of the second main body 2 in the X direction. The side surface 2E is located at the end of the second main body 2 in the −Y direction. The side surface 2F is located at the end of the second main body 2 in the Y direction.

The second main body 2 further includes a first terminal 2a, a second terminal 2b, a third terminal 2c, and a fourth terminal 2d that are disposed on an outer surface of the second main body 2, or more specifically, the fourth surface 2B. The first terminal 2a is disposed near the corner at the intersection of the fourth surface 2B, the side surface 2C, and the side surface 2E (see FIG. 2). The second terminal 2b is disposed near the corner at the intersection of the fourth surface 2B, the side surface 2C, and the side surface 2F (see FIG. 2). The third terminal 2c is disposed near the corner at the intersection of the fourth surface 2B, the side surface 2D, and the side surface 2E (see FIG. 2). The fourth terminal 2d is disposed near the corner at the intersection of the fourth surface 2B, the side surface 2D, and the side surface 2F (see FIG. 2).

The first and second terminals 2a and 2b are located on the −X direction side of the first to third ground conductor layers 81 to 83 of the first main body 1 when seen in the Z direction. The third and fourth terminals 2c and 2d are located on the X direction side of the first to third ground conductor layers 81 to 83 when seen in the Z direction. The first and third terminals 2a and 2c are disposed to sandwich the first to third ground conductor layers 81 to 83 therebetween when seen in the Z direction. The second and fourth terminals 2b and 2d are disposed to sandwich the first to third ground conductor layers 81 to 83 therebetween when seen in the Z direction.

With the second main body 2 mounted to the first main body 1, the first to fourth terminals 2a, 2b, 2c, and 2d of the second main body 2 are opposed to the terminals 121, 122, 123, and 124 of the first main body 1, respectively. The first to fourth terminals 2a, 2b, 2c, and 2d are physically connected to the terminals 121, 122, 123, and 124, respectively, by solder bumps 7, for example.

As shown in FIG. 1, the first circuit section 41 is provided between the first and second terminals 2a and 2b in the circuit configuration. The second circuit section 42 is provided between the third and fourth terminals 2c and 2d in the circuit configuration.

FIG. 4 shows the rough positions of the respective first and second circuit sections 41 and 42 in the second main body 2. The first circuit section 41 is disposed at a position closer to the side surface 2C than to the side surface 21) (see FIG. 2). The second circuit section 42 is disposed at a position closer to the side surface 2D than to the side surface 2C (see FIG. 2).

As shown in FIG. 4, the first to third ground conductor layers 81 to 83 are located between the first and second circuit sections 41 and 42 when seen in the Z direction. The first to third ground conductor layers 81 to 83 each protrude from the second main body 2, or more specifically, to the Y direction side of the second main body 2 and the −Y direction side of the second main body 2 when seen in the Z direction.

Next, the operation and effects of the electronic component 100 according to the present embodiment will be described. The electronic component 100 includes the first main body 1 including the plurality of dielectric layers stacked together, and the second main body 2 mounted to the first main body 1. The second main body includes the first and second circuit sections 41 and 42. The first main body 1 includes the first to third ground conductor layers 81 to 83 located between the first and second circuit sections 41 and 42 when seen in the Z direction. As will be described below, according to the present embodiment, the first to third ground conductor layers 81 to 83 can provide a sufficiently high isolation. According to the present embodiment, the electronic component 100 can thus be miniaturized in size and reduced in cost.

Figure 6:
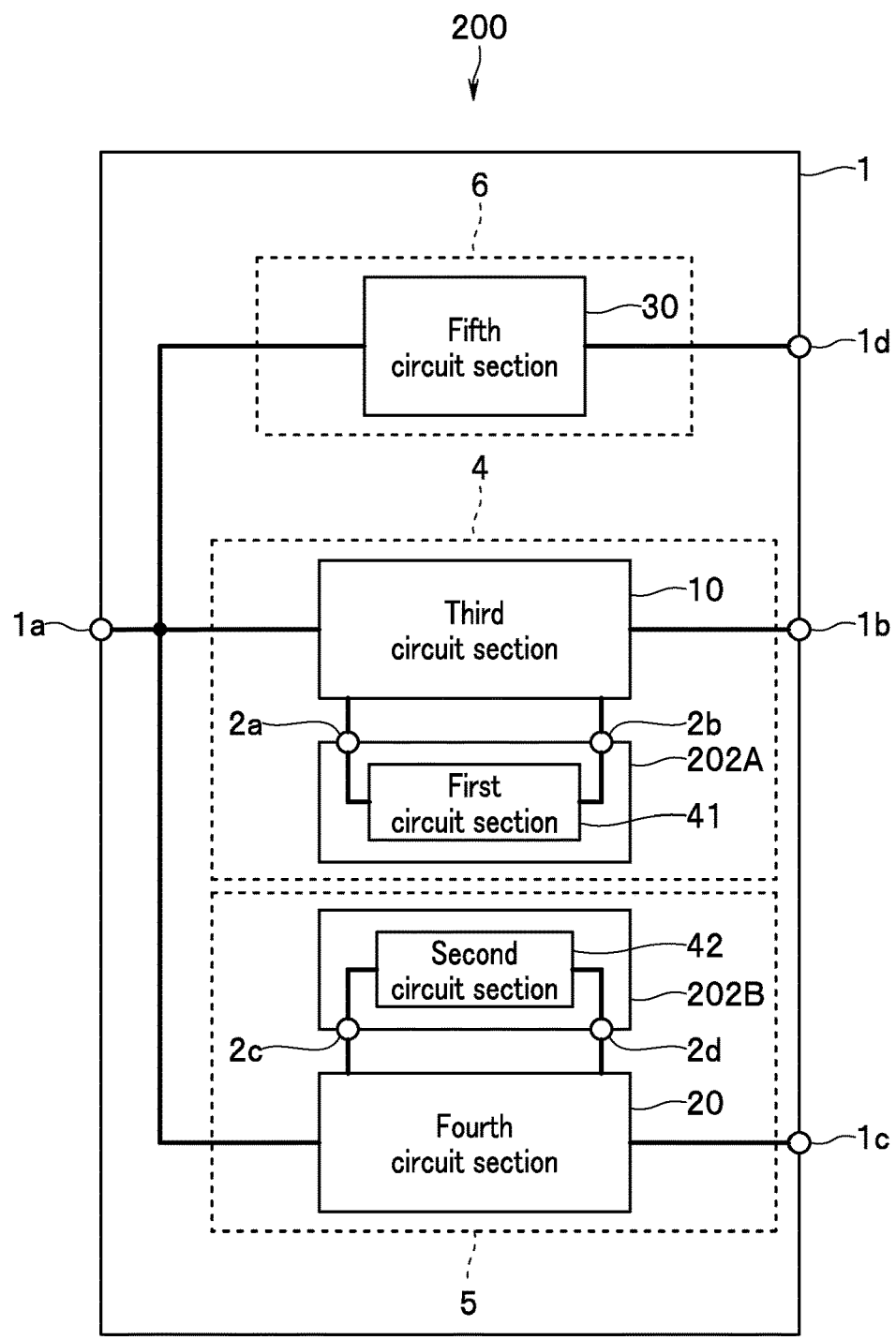
FIG. 6 is a block diagram showing a configuration of an electronic component of a first comparative example.

The effects of the electronic component 100 according to the present embodiment will now be described by comparison with electronic components of first and second comparative examples. Initially, an electronic component 200 of the first comparative example will be described. FIG. 6 is a block diagram showing a configuration of the electronic component 200 of the first comparative example.

The configuration of the electronic component 200 of the first comparative example is different from that of the electronic component 100 according to the present embodiment in the following points. The electronic component 200 of the first comparative example includes two main bodies 202A and 202B that are mounted to the first main body 1 and physically separated from each other instead of the second main body 2 of the present embodiment. The main body 202A includes the first circuit section 41 and the first and second terminals 2a and 2b. The main body 202B includes the second circuit section 42 and the third and fourth terminals 2c and 2d. In other respects, the configuration of the electronic component 200 of the first comparative example is the same as that of the electronic component 100 according to the present embodiment.

In the first comparative example, the main bodies 202A and 202B need to be disposed at some distance from each other to reduce the electromagnetic coupling (magnetic coupling and capacitive coupling) between the main bodies 202A and 202B. Since the planar shape (shape seen in the Z direction) of the first main body 1 needs to be made larger accordingly, the first main body 1 is difficult to miniaturize in the first comparative example. Moreover, electronic components such as the first main body 1 are typically manufactured by forming a substructure including a plurality of electronic components at least in part and cutting the substructure. The larger the planar shape of the electronic component, the smaller the number of electronic components obtained from a single substructure and the higher the manufacturing cost of the electronic component. In the first comparative example, the large planar shape of the first main body 1 increases the manufacturing cost of the first main body 1. For such a reason, in the first comparative example, the electronic component 200 is difficult to miniaturize and the manufacturing cost of the electronic component 200 increases. Moreover, in the first comparative example, two parts (main bodies 202A and 202B) need to be mounted to the first main body 1. This increases the manufacturing cost of the electronic component 200 as compared to the case where a single part is mounted to the first main body 1.

By contrast, in the present embodiment, only the second main body 2 is mounted to the first main body 1. According to the present embodiment, the electronic component 100 can thus be miniaturized in size and reduced in cost.

Figure 7:
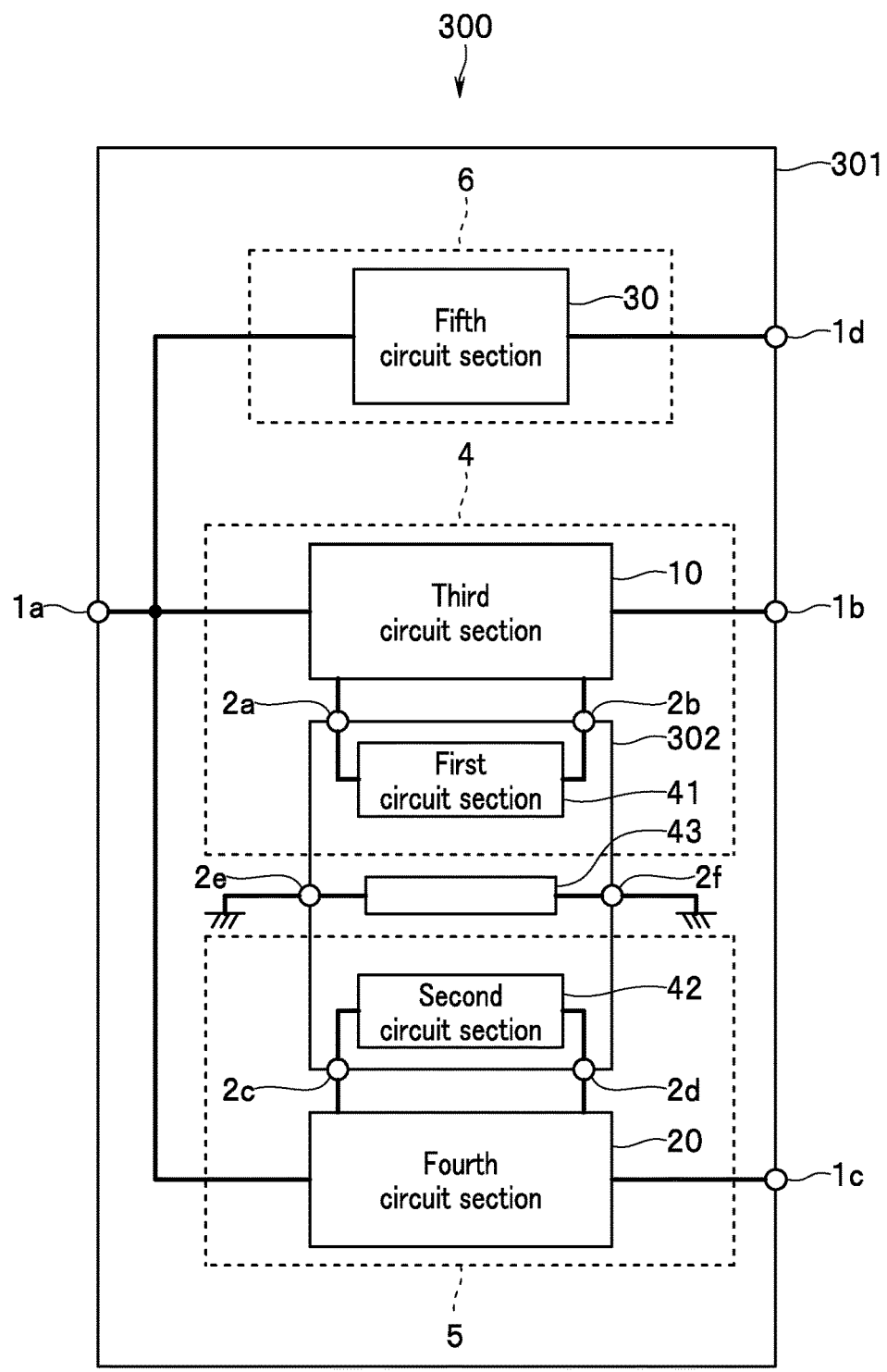
FIG. 7 is a block diagram showing a configuration of an electronic component of a second comparative example.

Next, an electronic component 300 of the second comparative example will be described. FIG. 7 is a block diagram showing a configuration of the electronic component 300 of the second comparative example.

The configuration of the electronic component 300 of the second comparative example is different from that of the electronic component 100 according to the present embodiment in the following points. The electronic component 300 of the second comparative example includes a first main body 301 instead of the first main body 1 of the present embodiment. The first main body 301 is configured in the same manner as the first main body 1 except that the partition 8 is not provided. The first main body 301 does not include the first to third ground conductor layers 81 to 83 of the present embodiment.

The electronic component 300 of the second comparative example also includes a second main body 302 instead of the second main body 2 of the present embodiment. Like the second main body 2, the second main body 302 includes the first and second circuit sections 41 and 42 and the first to fourth terminals 2a to 2d. The second main body 302 further includes a ground conductor layer 43 provided between the first and second circuit sections 41 and 42 inside the second main body 302, and two terminals 2e and 2f connected to the ground conductor layer 43. The terminal 2e is disposed between the first and second terminals 2a and 2b, on the outer surface (bottom surface) of the second main body 302. The terminal 2f is disposed between the third and fourth terminals 2c and 2d, on the outer surface (bottom surface) of the second main body 302. The terminals 2e and 2f are grounded.

In other respects, the configuration of the electronic component 300 of the second comparative example is the same as that of the electronic component 100 according to the present embodiment.

In the second comparative example, the ground conductor layer 43 is provided inside the second main body 302. In the second comparative example, the planar shape (shape seen in the Z direction) of the second main body 302 is larger than in the case without the ground conductor layer 43 disposed. This increases the manufacturing cost of the second main body 302, and consequently increases the manufacturing cost of the electronic component 300 as well. Moreover, in the second comparative example, the number of terminals is greater than in the case without the ground conductor layer 43 disposed. This also makes the planar shape of the second main body 302 larger, and increases the manufacturing cost of the electronic component 300.

By contrast, in the present embodiment, no ground conductor layer is disposed inside the second main body 2. According to the present embodiment, the electronic component 100 can thus be miniaturized in size and reduced in cost.

Next, a result of a simulation examining an isolation characteristic of the electronic component 100 according to the present embodiment will be described. A model of a practical example used in the simulation will initially be described. The model of the practical example is a model for the electronic component 100 according to the present embodiment. In the simulation, the first circuit section, 41, the second circuit section 42, the third circuit section 10, the fourth circuit section 20, and the fifth circuit section 30 were designed to make the model of the practical example function as a branching filter.

Figure 8:
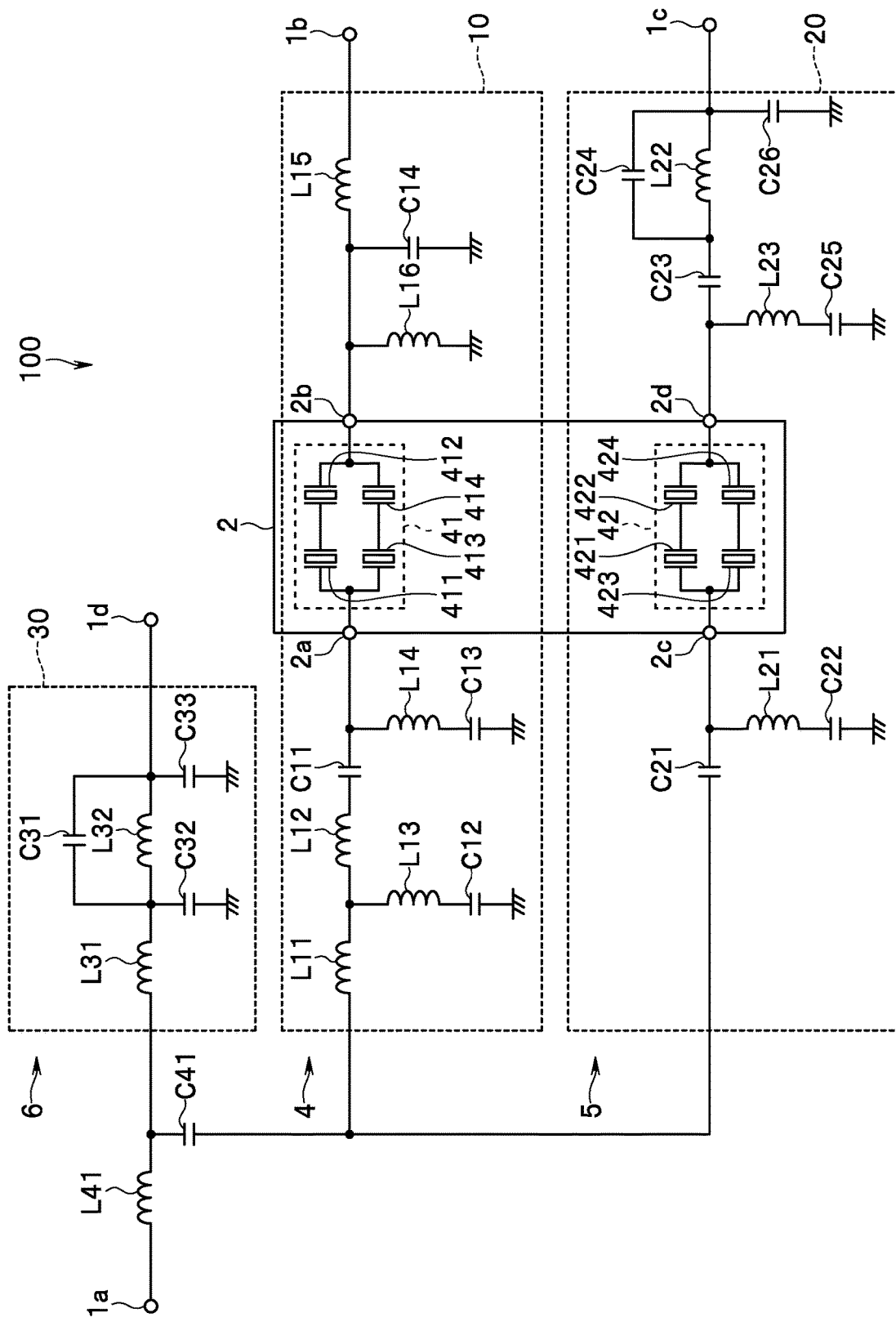
FIG. 8 is a circuit diagram showing a circuit configuration of a model of a practical example used in a simulation.

FIG. 8 is a circuit diagram showing a circuit configuration of the model of the practical example. The model of the practical example includes an inductor L41 and a capacitor C41 in addition to the first, second, third, fourth, and fifth circuit sections 41, 42, 10, 20, and 30. One end of the inductor L41 is connected to the common port 1a. The other end of the inductor L41 is connected to the fifth circuit section 30 and one end of the capacitor C41.

The first circuit section 41 includes four acoustic wave elements 411, 412, 413, and 414. One end of each of the acoustic wave elements 411 and 413 is connected to the first terminal 2a. The other end of the acoustic wave element 411 is connected to one end of the acoustic wave element 412. The other end of the acoustic wave element 413 is connected to one end of the acoustic wave element 414. The other ends of the acoustic wave elements 412 and 414 are connected to the second terminal 2b.

The second circuit section 42 includes four acoustic wave elements 421, 422, 423, and 424. One end of each of the acoustic wave elements 421 and 423 is connected to the third terminal 2c. The other end of the acoustic wave element 421 is connected to one end of the acoustic wave element 422. The other end of the acoustic wave element 423 is connected to one end of the acoustic wave element 424. The other ends of the acoustic wave elements 422 and 424 are connected to the fourth terminal 2d.

The third circuit section 10 includes inductors L11, L12, L13, L14, L15, and L16, and capacitors C11, C12, C13, and C14. One end of the inductor L11 is connected to the other end of the capacitor C41. The other end of the inductor L11 is connected to one end of the inductor L12. The other end of the inductor L12 is connected to one end of the capacitor C11. The other end of the capacitor C11 is connected to the first terminal 2a of the second main body 2.

One end of the inductor L13 is connected to the connection point of the inductors L11 and L12. The other end of the inductor L13 is connected to one end of the capacitor C12. The other end of the capacitor C12 is grounded.

One end of the inductor L14 is connected to the other end of the capacitor C11. The other end of the inductor L14 is connected to one end of the capacitor C13. The other end of the capacitor C13 is grounded.

One end of the inductor L15 is connected to the second terminal 2b of the second main body 2. The other end of the inductor L15 is connected to the first signal port 1b. One end of the inductor L16 and one end of the capacitor C14 are connected to the one end of the inductor L15. The other ends of the inductor L16 and the capacitor C14 are grounded.

The fourth circuit section 20 includes inductors L21, L22, and L23, and capacitors C21, C22, C23, C24, C25, and C26. One end of the capacitor C21 is connected to the other end of the capacitor C41. The other end of the capacitor C21 is connected to the third terminal 2c of the second main body 2. One end of the inductor L21 is connected to the other end of the capacitor C21. The other end of the inductor L21 is connected to one end of the capacitor C22. The other end of the capacitor C22 is grounded.

One end of the capacitor C23 is connected to the fourth terminal 2d of the second main body 2. The other end of the capacitor C23 is connected to one end of the inductor L22. The other end of the inductor L22 is connected to the second signal port 1c. The capacitor C24 is connected in parallel with the inductor L22.

One end of the inductor L23 is connected to the one end of the capacitor C23. The other end of the inductor L23 is connected to one end of the capacitor C25. The other end of the capacitor C25 is grounded.

One end of the capacitor C26 is connected to the other end of the inductor L22. The other end of the capacitor C26 is grounded.

The fifth circuit section 30 includes inductors L31 and L32, and capacitors C31, C32, and C33. One end of the inductor L31 is connected to the other end of the inductor L41. The other end of the inductor L31 is connected to one end of the inductor L32. The other end of the inductor L32 is connected to the third signal port 1d.

The capacitor C31 is connected in parallel with the inductor L32. One end of the capacitor C32 is connected to the connection point of the inductors L31 and L32. The other end of the capacitor C32 is grounded. One end of the capacitor C33 is connected to the other end of the inductor L32. The other end of the capacitor C33 is grounded.

The plurality of inductors and the plurality of capacitors shown in FIG. 8 are constituted using the plurality of dielectric layers, the plurality of conductor layers, and the plurality of through holes of the stack 50.

Next, a model of a third comparative example used in the simulation will be described. The model of the third comparative example is a model obtained by removing the partition 8 from the model of the practical example. The model of the third comparative example therefore is not provided with the first to third ground conductor layers 81 to 83.

Next, the result of the simulation will be described. In the simulation, the model of the practical example and the model of the third comparative example were each examined for the frequency characteristic of isolation between the first and second filters 4 and 5, the pass characteristic of the first filter 4, and the pass characteristic of the second filter 5. The isolation in the simulation is defined as follows. Suppose that a high frequency signal of power P1 is input to the first signal port 1b and a signal of power P2 is output from the second signal port 1c. Isolation I is defined by the following Eq. (1):

$$I = 10 \log(P2/P1) \tag{1}$$

Figure 9:
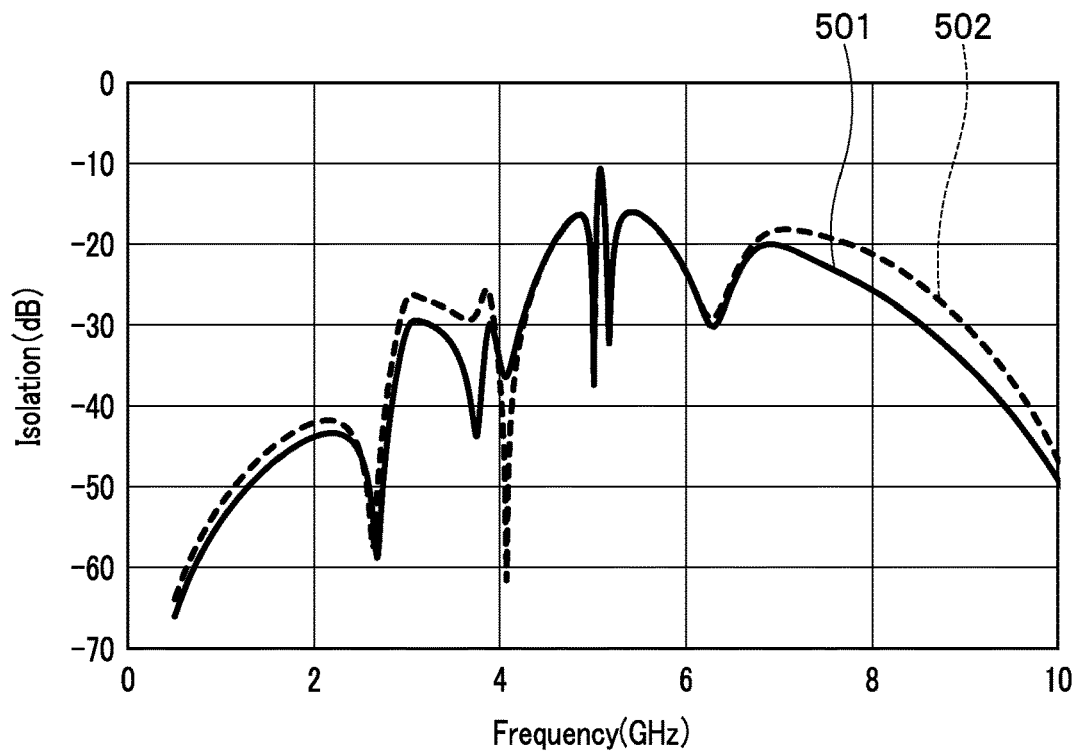
FIG. 9 is a characteristic chart showing the frequency characteristic of isolation determined by the simulation.
Figure 10:
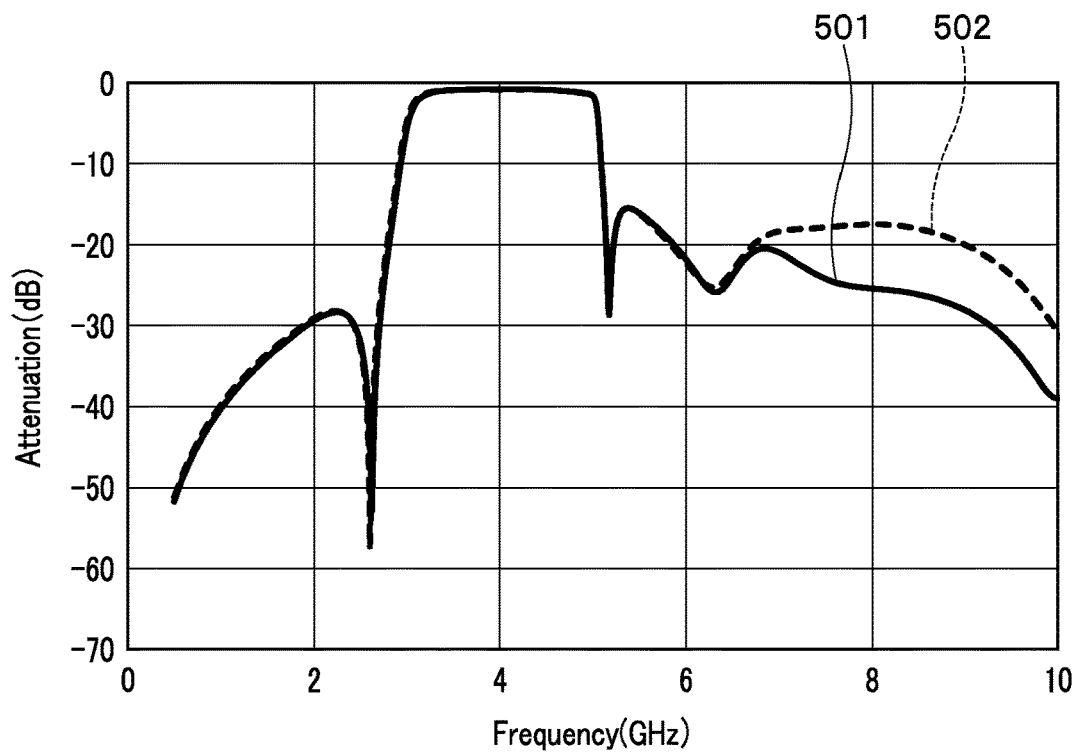
FIG. 10 is a characteristic chart showing the pass characteristic of a first filter determined by the simulation.
Figure 11:
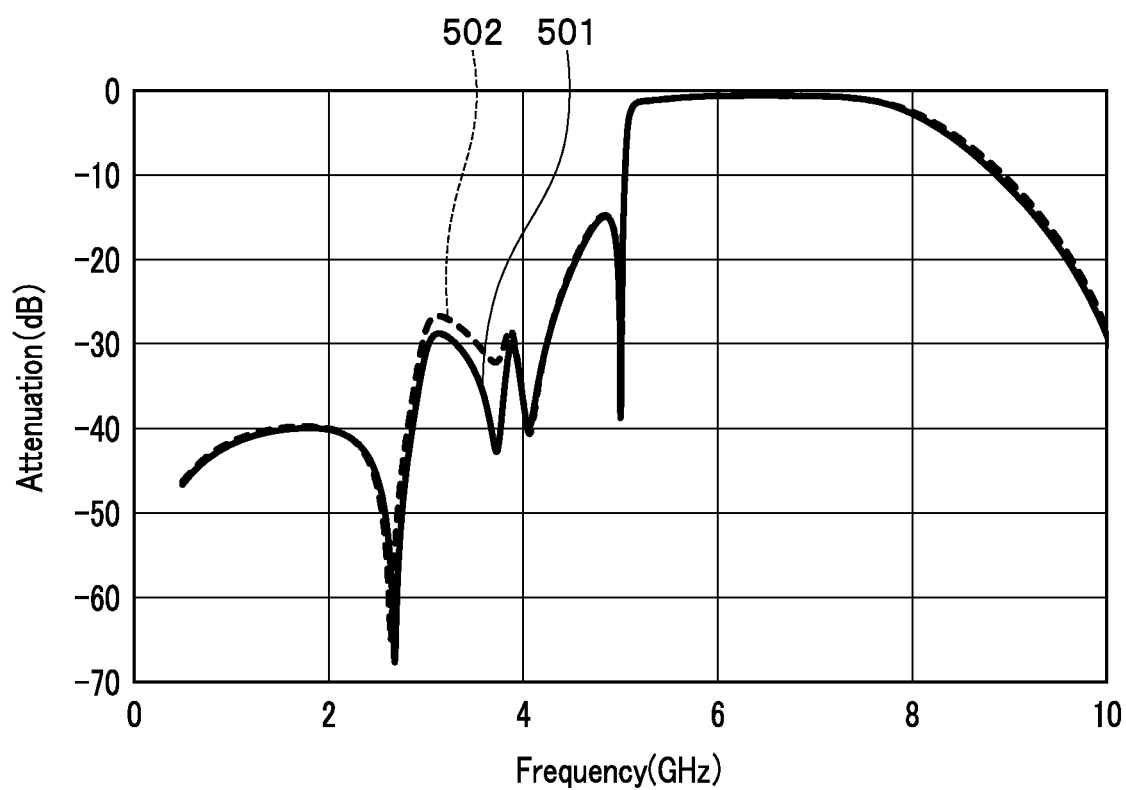
FIG. 11 is a characteristic chart showing the pass characteristic of a second filter determined by the simulation.

FIG. 9 is a characteristic chart showing the frequency characteristic of the isolation. FIG. 10 is a characteristic chart showing the pass characteristic of the first filter 4. FIG. 11 is a characteristic chart showing the pass characteristic of the second filter 5. In FIG. 9 to FIG. 11, the horizontal axis indicates the frequency. In FIG. 9, the vertical axis indicates the isolation. In FIG. 10 and FIG. 11, the vertical axis indicates an attenuation. In FIG. 9 to FIG. 11, the curve denoted by the reference numeral 501 represents the characteristic of the model of the practical example. The curve denoted by the reference numeral 502 represents the characteristic of the model of the third comparative example.

As shown in FIG. 9, the model of the practical example (501) showed an isolation of large absolute value compared to the model of the third comparative example (502). As shown in FIG. 10, the model of the practical example (501) showed an attenuation of large absolute value in a frequency range that is higher than the first passband of the first filter 4 and includes the second passband of the second filter 5, compared to the model of the third comparative example (502). As shown in FIG. 11, the model of the practical example (501) showed an attenuation of large absolute value in a frequency range that is lower than the second passband of the second filter 5 and includes the first passband of the first filter 4, compared to the model of the third comparative example (502).

From the result of the simulation, it can be seen that the model of the practical example provides a sufficiently high isolation since the first and second filters 4 and 5 each provide an attenuation of sufficiently large absolute value outside their passband. As understood from the result of the simulation that, according to the present embodiment, the isolation can be made sufficiently high by the first to third ground conductor layers 81 to 83.

Next, other effects of the present embodiment will be described. In the present embodiment, the first to third ground conductor layers 81 to 83 are provided inside the first main body 1, i.e., inside the stack 50. According to the present embodiment, a short-circuit between the ground conductor layers and the first to fourth terminals 2a to 2d of the second main body 2 can thereby be prevented. In addition, the distance between the first and third terminals 2a and 2c and the distance between the second and fourth terminals 2b and 2d can be reduced.

In the present embodiment, the first to third ground conductor layers 81 to 83 are disposed at a position closer to the first surface 50A than to the second surface 50B. According to the present embodiment, the isolation can thus be increased more effectively than a case where the first to third ground conductor layers 81 to 83 are disposed at a position closer to the second surface 50B.

Now, if through holes have a large dimension in the direction parallel to the Z direction, the stack 50 can be deformed due to the through holes. By contrast, in the present embodiment, the plurality of first through holes 91 and the plurality of second through holes 92 are disposed so as not to overlap when seen in the Z direction. According to the present embodiment, the deformation of the stack 50 can thereby be prevented.

The present invention is not limited to the abovementioned embodiment, and various modifications may be made thereto. For example, the electronic component of the present invention may be a diplexer including two filters.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiment.

What is claimed is:
1. An electronic component comprising:
a first main body including a plurality of dielectric layers stacked together; and
a second main body mounted to the first main body, wherein:

the second main body includes a first circuit section and a second circuit section, both of the first circuit section and the second circuit section being provided inside the second main body, and the first circuit section and the second circuit section being each constituted by using at least one acoustic wave element and being electrically separated from each other;

the first main body includes at least one ground conductor layer located between the first and second circuit sections when seen in a first direction parallel to a direction in which the first and second main bodies are arranged;

the second main body is in a form of a single box; and both of the first circuit section and the second circuit section are provided inside the single box.

2. The electronic component according to claim 1, wherein the first direction is a direction parallel to a stacking direction of the plurality of dielectric layers.

3. The electronic component according to claim 1, wherein:

the second main body includes a first terminal, a second terminal, a third terminal, and a fourth terminal that are disposed on an outer surface of the second main body;

the first circuit section is provided between the first and second terminals in a circuit configuration;

the second circuit section is provided between the third and fourth terminals in the circuit configuration;

the first and third terminals are disposed to sandwich the at least one ground conductor layer therebetween when seen in the first direction; and the second and fourth terminals are disposed to sandwich the at least one ground conductor layer therebetween when seen in the first direction.

4. The electronic component according to claim 1, wherein the at least one ground conductor layer protrudes from the second main body when seen in the first direction.

5. The electronic component according to claim 1, wherein the at least one ground conductor layer is provided inside the first main body.

6. The electronic component according to claim 5, wherein:

the first main body has a first surface where the second main body is mounted, and a second surface opposite thereto; and the at least one ground conductor layer is disposed at a position closer to the first surface than to the second surface.

7. The electronic component according to claim 1, wherein the at least one ground conductor layer includes a plurality of ground conductor layers.

8. The electronic component according to claim 7, wherein the first main body further includes a plurality of through holes that connect the plurality of ground conductor layers to each other.

9. The electronic component according to claim 8, wherein:

the plurality of ground conductor layers include a first ground conductor layer, a second ground conductor layer, and a third ground conductor layer that are disposed at respective different positions in the first direction;

the plurality of through holes include a plurality of first through holes that electrically connect the first and second ground conductor layers, and a plurality of second through holes that electrically connect the second and third ground conductor layers; and the plurality of first through holes and the plurality of second through holes are disposed so as not to overlap when seen in the first direction.

10. The electronic component according to claim 1, wherein the first main body includes a third circuit section and a fourth circuit section that are disposed to sandwich the at least one ground conductor layer therebetween when seen in the first direction.

11. The electronic component according to claim 10, wherein:

the first circuit section is electrically connected to the third circuit section; and the second circuit section is electrically connected to the fourth circuit section.

12. The electronic component according to claim 11, wherein:

the first and third circuit sections constitute a first filter that selectively passes a signal of a frequency within a first passband; and the second and fourth circuit sections constitute a second filter that selectively passes a signal of a frequency within a second passband higher than the first passband.

* * * * *